United States Patent [19]
Yoo et al.

[11] Patent Number: 5,636,171
[45] Date of Patent: Jun. 3, 1997

[54] SEMICONDUCTOR MEMORY DEVICE HAVING LOW POWER SELF REFRESH AND BURN-IN FUNCTIONS

[75] Inventors: Seung-Moon Yoo, Suwon; Ejaz Ul Haq, Seoul, both of Rep. of Korea

[73] Assignee: Samsung Electronics Co., Ltd., Suwon, Rep. of Korea

[21] Appl. No.: 580,645

[22] Filed: Dec. 29, 1995

Related U.S. Application Data

[62] Division of Ser. No. 380,975, Jan. 31, 1995, abandoned.

[30] Foreign Application Priority Data

Jun. 4, 1994 [KR] Rep. of Korea ............... 12654/1994

[51] Int. Cl.$^6$ .................................................. G11C 7/00
[52] U.S. Cl. ........................... 365/222; 365/230.06
[58] Field of Search ........................... 365/222, 230.06, 365/230.08

[56] References Cited

U.S. PATENT DOCUMENTS

| | | | |
|---|---|---|---|
| 5,130,923 | 7/1992 | Warriner et al. | 365/236 |
| 5,146,430 | 9/1992 | Torimaru et al. | 365/236 |
| 5,283,764 | 2/1994 | Kim et al. | 365/222 |
| 5,361,237 | 11/1994 | Chishiki | 365/230.06 |
| 5,365,487 | 11/1994 | Patel et al. | 365/222 X |

*Primary Examiner*—David C. Nelms
*Assistant Examiner*—Huan Hoang
*Attorney, Agent, or Firm*—Cushman Darby & Cushman, IP Group of Pillsbury Madison & Sutro LLP

[57] ABSTRACT

The present invention relates to a semiconductor memory device and more particularly to a semiconductor memory device capable of executing a self-refresh operation to achieve a low power consumption, and of executing a burn-in operation in wafer and package states as well. A semiconductor memory device comprising a plurality of memory cells arranged in rows and columns, a word line being arranged in each row to select the rows of the plurality of memory cells in response to an input of row address, a bit line being arranged in each column to select the columns of the plurality of memory cells in response to an input of column address, and the row address for designating a row accessed in a previous selection operation upon selection of an arbitrary word line comprising a controller for executing the arbitrary word line selection.

4 Claims, 4 Drawing Sheets

FIG. 5

SEMICONDUCTOR MEMORY DEVICE HAVING LOW POWER SELF REFRESH AND BURN-IN FUNCTIONS

This a division of application Ser. No. 08/380,975, filed Jan. 31, 1995, now abandoned.

FIELD OF THE INVENTION

The present invention relates to a semiconductor memory device and more particularly to a semiconductor memory device capable of executing a self-refresh operation to achieve low power consumption, and of executing a burn-in operation in wafer and package states as well.

BACKGROUND OF THE INVENTION

The density of dynamic random access memories (hereinafter, referred to as DRAMS) used as a main memory device in computer systems, have increased about four-fold every three years, and efforts to develop is high speed operation and lower power consumption. High speed operation is desired to reduce the operating speed gap between a central processing unit CPU and the DRAM, and lower power consumption is especially desired in portable devices. DRAMS intended to achieve the high speed operation include synchronous DRAMS using a system clock and a rambus DRAM, while DRAMS intended to achieve the lower power operation includes low power DRAMs aiming at efficient battery operation. The technical art on the rambus DRAM is disclosed in pages 66 to 67 of a paper "symposium on VLSI circuits digest of technical papers 1992" written by N. kushiyama, et at., entitled "500 Mbyte/sec data-rate 512 Kbits×9 DRAM using a novel I/O interface". And a conventional synchronous DRAM is disclosed in pages 65 to 66 of a paper "symposium on VLSI circuits digest of technical papers 1993" written by yun-ho CHOI, et al., entitled "16 Mbit synchronous DRAM with 125 Mbyte/sec data rate". A conventional lower power DRAM is disclosed in pages 1112 to 1116 of a paper "IEEE journal of solid-state circuits, vol.25, Oct. 1990" written by Yasuhiro, et al., entitled "A 38-ns 4-Mb DRAM with a battery-backup (BBU) mode", and in pages 1556 to 1561 of a paper "IEEE journal of solid-state circuits, vol.26, Nov. 1991" written by Katsuyuki, et at., entitled "A 4-Mb pseudo SRAM operating at 2.6±1 V with 3 µA data retention current".

Since data stored in a memory cell of the DRAM disappears, i.e. discharges with the lapse of time, the data of memory cell data must be periodically recharged, which is commonly referred to as a refresh operation. Such a refresh operation is typically executed by a DRAM controller, which is divided into ROR refresh, hidden refresh, CBR( $\overline{CAS}$ before $\overline{RAS}$) refresh, and extended CBR refresh operations in accordance with the performance manner. Recently, a self-refresh operation which extends the extended CBR refresh operation is widely used. The self-refresh operation reduces to a maximum extent the power consumption in the DRAM device to extend the operating time of the computer system using a battery. If not using the DRAM, that is in case where an access to the DRAM is not performed for a long time, the self-refresh operation suppresses to a maximum extent the operation of the DRAM to reduce the power consumption of the DRAM. For example, if a user using a laptop computer for word processing work in an airport is to fly to another place, since a constant level of power is not supplied to the computer, the computer used on boarding should be operable for a long time without interruption by the battery installed therein. A very important concern is not the processing speed of the computer, but the extension of time available for use of the computer by suppressing power consumption. That is, it is important how long the usage time of the computer can be extended without loss of data stored in the DRAM. Further, in other systems, and particularly, when the DRAM is not accessed, the reduction of the power consumption by the DRAM is very important.

The self-refresh operation typically used in the refresh operation of DRAM is executed in the following manner. Generally, a self-refresh input signal is made up of combination of a CBR and a timer output. When a CBR cycle is set up, a normal operation is halted and a refresh mode begins. Here, word line selection is sequentially made not by an external address but by a counter installed in the interior of a chip. Further, a data output operation to the exterior of the chip is not performed and only a cell data restoring operation in the interior of the chip is performed. The difference between the CBR refresh operation and the ROR refresh operation as mentioned above is in the ROR refresh operation, the word line selection is made by the address given by a controller, but in the CBR refresh operation, only a CBR refresh input signal is received from the controller and remaining operations are executed by an on-chip internal circuit. Compared with the ROR refresh operation, the CBR refresh operation has the advantage of lessening the burden of the controller. A latch operation of a row address for selecting a word line is executed by a toggling of a row address strobe signal $\overline{RAS}$.

Figure 1:
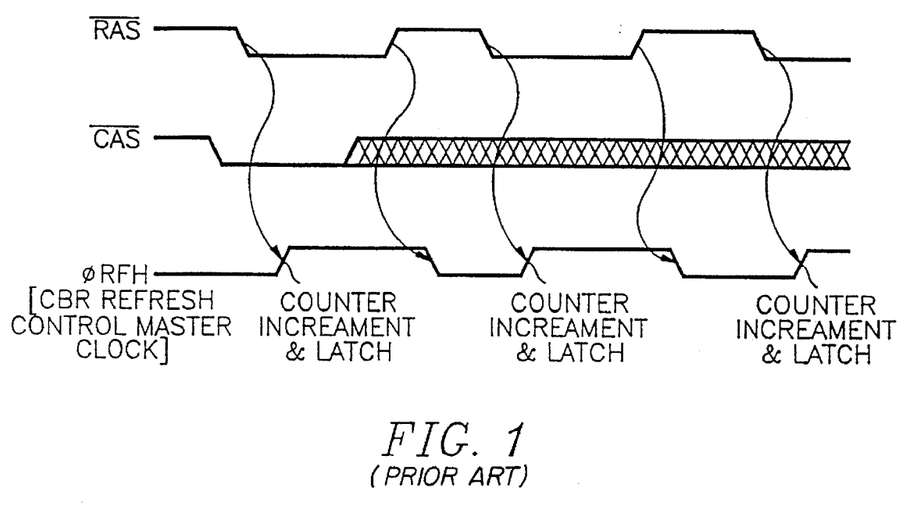
FIG. 1 is a timing diagram while executing a representative CBR refresh operation in a semiconductor memory device.

FIG. 1 is a timing diagram showing execution of the CBR refresh operation. Upon input of CBR, a first row address latch is determined by the output of a counter within the chip, and the next row address latch is executed by an activation input of the signal $\overline{RAS}$. In such a manner as mentioned above, the refresh operation for every memory cells within the chip is completed.

In case of the self-refresh operation, the refresh operation is executed in the manner of adding the CBR refresh to a timer. In other words, after the refresh mode is started by the CBR cycle, if the toggling of the signal $\overline{RAS}$ is not executed during a given time period (150 µs), a signal informs the self-refresh input is generated the self-refresh mode is implemented, and a signal that is part of the $\overline{RAS}$ chain occurs by a first CBR cycle is thereby disabled and the refresh operation is performed by an internal self-refresh circuit. The main distinction between the CBR and self-refresh operations lies in that the self-refresh operation is capable of controlling a refresh period in accordance with the characteristic of each DRAM device. That is, after the self-refresh mode begins and each word line is enabled, the refresh period of memory cell is determined by an oscillator having variable periods within the chip. As well known in the art, the refresh period of the DRAM device is determined by JEDEC which defines a semiconductor size standardization. For example, in case of 4 M DRAM device, the refresh specification therefore is determined as 1K cycle/16 ms. Every 1K/16 ms =1/15.625 µs, i.e. at least 15.625 µs, the refresh operation for cell of the DRAM should be carried out. However, data retention time period of a real measured cell is much longer than the time period of 15.625 µs, thereby allowing for a longer self-refresh period. Moreover, although the time period of 15.625 µs is that assigned for the refresh operation of the DRAM, as the current generation DRAM is changed to the new generation, the system itself will endeavor to maintain the time period, one object of which endeavor may lie in compatibility between the current and new generations.

Since the number of arrays to be activated in on-chip increases as the density of the DRAM device increases, many difficulties will be arise in satisfying duty cycles, i.e. 1 cycle /15.625 μs. For instance in the case of a 16 M DRAM device, the refresh specification therefor is determined as 2K/32 ms. If there are 128 memory cells per one bit line, a 2 M memory cell array is refreshed by the toggling of the signal $\overline{RAS}$ under a folded bit line architecture. In this case, if a bit line capacitance is 250 fF and an operating voltage is 5 volts, the current required for refreshing cell data of arrays becomes 250 fF * 5/2 * 4 * 2K/100 ns=51.2 mA in the cycle time 100 ns, which corresponds to an average current value. If array sensing operation is accomplished within 10 ns, the current required during the cycle time may correspond to 10 times of the current value in the cycle time 100 ns, and in addition thereto, the value of a peak current may become drastically higher. The important factors in determining the value of array current are a bit line capacitance, operational voltage, array activated by refresh cycle, etc. Hence, to reduce an amount of current consumption, adjustment of the cell number per bit line (for example, if the cell number per bit line corresponds not to 128, but to 64, almost half of the bit line capacitance may be reduced) and adjustment for falling the operating voltage (for example, 5 volts fails to 3.3 volts) have been chosen. On the other hand, the operating voltage may be adjusted in accordance with the refresh cycle, for which the cell refresh time is adjusted while maintaining the duty cycle 15.625 μs (for instance, if the cell refresh time is adjusted from 1K/16 ms to 2K/32 ms, since the number of word lines enabled at a time is reduced to be half, upon a normal operation, half of the current consumed by array is reduced). As will be seen from above, an aim of the self-refresh operation is to reduce the operational current by refresh cycle adjustment, i.e. the power consumption. In one self-refresh application after cell data retention time of a corresponding DRAM device is measured, the self-refresh period is then determined. Here, assuming that the refresh period is 1K cycle/16 ms during the normal operation of the DRAM device and the measured cell data retention time is one second, the self-refresh period becomes 1 s/1024=976.5 μs. That is, since during the normal operation the self-refresh operation is executed every 15.625 μs, but once the self-refresh mode begins, is executed every 976.5 μs, the power consumption by array become reduced as low as 976.5/15.625=62.5 times or so. The self-refresh period is made by using a laser fuse once in in a wafer state or an electrical fuse a package state. Consequently, one of main aims of the self-refresh operation is to extend operational life of a battery by minimizing DRAM operation to an extent capable of maintaining cell data when the DRAM device is not accessed during a preset time period.

The components of power consumed during the operation of DRAM device can be divided into firstly, a DC current component constantly consumed irrespective of an activation state or stand-by state, secondly an, array current component consumed in an array portion such as bit line capacitance charging and discharging, and thirdly, a peripheral circuit current component consumed in driving the DRAM device. In the self-refresh mode, as mentioned above, the power consumption in the DRAM device is reduced by lengthening the self-refresh operation period.

Figure 2:
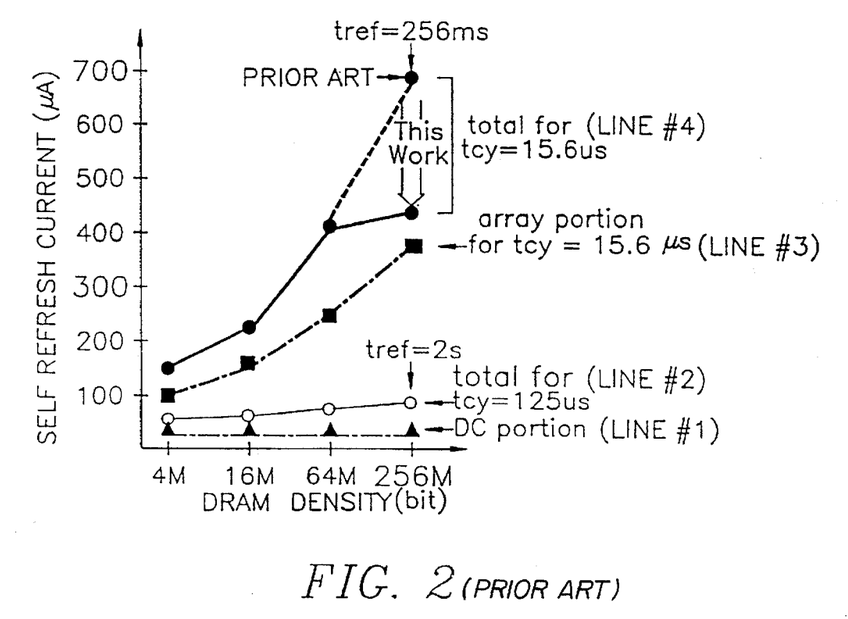
FIG. 2 is a graphical illustration of comparing density of a conventional DRAM and a DRAM according to the present invention with a self-refresh current consumed thereby.

FIG. 2 is a graphical illustration comparing density according to DRAM devices with current consumed by a self-refresh operation. Here, a first line indicates the DC current, and a second line indicates a total self-refresh current in case where the self-refresh period as 125 μs corresponds to 8 times or so of the normal operation. As the density of the DRAM device increases, however, there is a problem in determining the self-refresh period, because the self-refresh period can not increase at a rate of a current self-refresh period. For instance, assuming that the self-refresh operation has a cell data refresh period of 8 times as many periods as the normal operation has. In a 4 M DRAM device, as a normal operation period is 16 ms, the self-refresh period becomes 128 ms, and in 16 M DRAM device, as the normal operation period is 32 ms or 64 ms, the self-refresh period becomes 256 ms or 512 ms. In 64 M DRAM device, as the normal operation period is 64 ms or 128 ms, the self-refresh period becomes 512 s or 1 s, and in 256 M DRAM device, as the normal operation period is 128 or 256 ms, the self-refresh period becomes 1 s or 2 s. It can be expected from such increasing periods that the self-refresh periods do not increase in proportion to each other.

The real size of a memory cell is very tiny as the density of the DRAM device increases, and the operating voltage in view of power consumption and device reliability becomes lower as the number of arrays activated at a time increases. Since the total amount of charge stored in the memory cell is small, the cell data retention time gets increasingly shortened as the density of the DRAM device increases. Therefore, in the 256 M DRAM device, it is almost impossible to expect that the self-refresh period is 2 s and that the self-refresh period has the same 256 ms as the normal operation period in accordance with the cell size and operating voltage. Consequently, technology on conventional DRAM devices has a difficulty in reducing the self-refresh current in the DRAMS having a memory cell density of more than 64 M.

As discussed above, the self-refresh current components are divided the DC, array and peripheral circuit components. The DC current component is always consumed by TTL input buffer such as the signals $\overline{RAS}$ and $\overline{CAS}$, and an internal bias generating circuit irrespective of the activation of device or waiting state, the array current component is consumed by the charging/discharging of the bit line capacitance, and the peripheral circuit current component is consumed by the peripheral circuit for driving the DRAM device, which component is originated from the DC current produced when each internal node is charged/discharged and each signal is changed during operation of the peripheral circuit. An internal signal line is lengthened as the size of the DRAM device is large and as a result, the capacitance to be charged/discharged in the signal line increases and the density of DRAM increases, so the current component according to the operation of the peripheral circuit becomes larger. FIG. 2 shows such an increment state. As the density of the DRAM increases, the peripheral circuit current component is accordingly augmented. In the 256 M DRAM device, the peripheral circuit current component occupies the almost half of the total self-refresh currents. (in FIG. 2, third and fourth lines represent the peripheral circuit current component of the total self-refresh current and the total self-refresh current, respectively).

SUMMARY OF THE INVENTION

It is therefore one object of the present invention to provide a semiconductor memory device capable of reducing power consumption during a self-refresh operation.

It is another object of the present invention to provide a semiconductor memory device which minimizes a peripheral circuit current component in self-refresh current components as the density of a dynamic random access memory increases, thereby reducing the whole current.

It is still another object of the present invention to provide a semiconductor memory device which embodies a low power self-refresh operation and prevents an occurrence of peak currents.

It is still another object of the present invention to provide a semiconductor memory device capable of executing a high-speed burn-in operation in wafer and package states.

It is a further object of the present invention to provide a self-refresh method of a semiconductor memory device which embodies a low power self-refresh operation and prevents a peak currents.

It is still a further object of the present invention to provide a burn-in method of a semiconductor memory device capable of executing a high-speed burn-in operation in wafer and package states.

To achieve these objects, the present invention is directed to a semiconductor memory device. One embodiment comprises a plurality of memory cells arranged in rows and columns, a word line arranged in each row to select one of the rows of the plurality of memory cells in response to an input of row address, a bit line arranged in each column to select one of the columns of the plurality of memory cells in response to an input of column address, and a controller for executing selection operation of another word line based on the previously selected row adress.

In another embodiment a memory cell array has a plurality of memory cells in rows and columns. A first word line driver selects first word line connected to a row of a first memory cells arranged in the row direction. A second word line driver selects a second word line connected to row of a second memory cells arranged in the row direction. A first row decoder drives the first word line driver in response to a first combination input of a row address and, a second row decoder drives the second word line driver in response to a second combination input of the row address. A register drives the second word line driver based on an output of the first row decoder in response to a given control signal, the register whose input terminal being connected to an output terminal of the first row decoder and an output terminal being connected to an input terminal of the second row decoder.

A self-refresh method of a semiconductor memory device, comprises the steps of sensing a self-refresh mode, generating an address by a counter upon the self-refresh mode, selecting a first word line to be refreshed through a first row decoder by using an output of the counter, executing a refresh operation for memory cells connected to the first word line, generating a carry in response to selection of the first word line and the refresh operation, latching the carry to a second row decoder, and executing the refresh operation for a second word line different from the first word line through the latched carry.

A self-refresh method of a semiconductor memory device including a memory cell array having a plurality of memory cells in rows and columns, comprises the steps of selecting a first word line connected to a row of a first memory cell arranged in the row direction by a first word line driver, selecting a second word line connected to a row of a second memory cell arranged in the row direction by a second word line driver, driving the first word line driver in response to a first combination input of a row address by a first row decoder, driving the second word line driver in response to a second combination input of a row address by a second row decoder, controlling a driving of the second word line driver to a carry as an output of the first row decoder in response to an input of a given control signal by constituting a carry generator whose input terminal being connected to an output terminal of the first row decoder and whose output terminal being connected to an output terminal of the second row decoder, and upon a self-refresh operation, completing a word line selection by the carry.

A burn-in method of a semiconductor memory device comprises the steps of sensing a burn-in mode, generating an address by a counter upon the burn-in mode, selecting a first word line to be burnt-in through a first row decoder by using an output of the counter, executing a burn-in operation for memory cells connected to the first word line, generating a carry in response to selection of the first word line and the burn-in operation, latching the carry to a second row decoder, and executing the burn-in operation for a second word line different from the first word line through the latched carry.

BRIEF DESCRIPTION OF DRAWING

These and other objects, features, and advantages of the present invention are better understood by reading the following detailed description of the invention, taken in conjunction with the accompanying drawings. In the drawings, it should be noted that like elements represent like symbols or reference numerals, wherein.

DETAILED DESCRIPTION OF THE PREFERRED EMBODIMENTS

Figure 3:
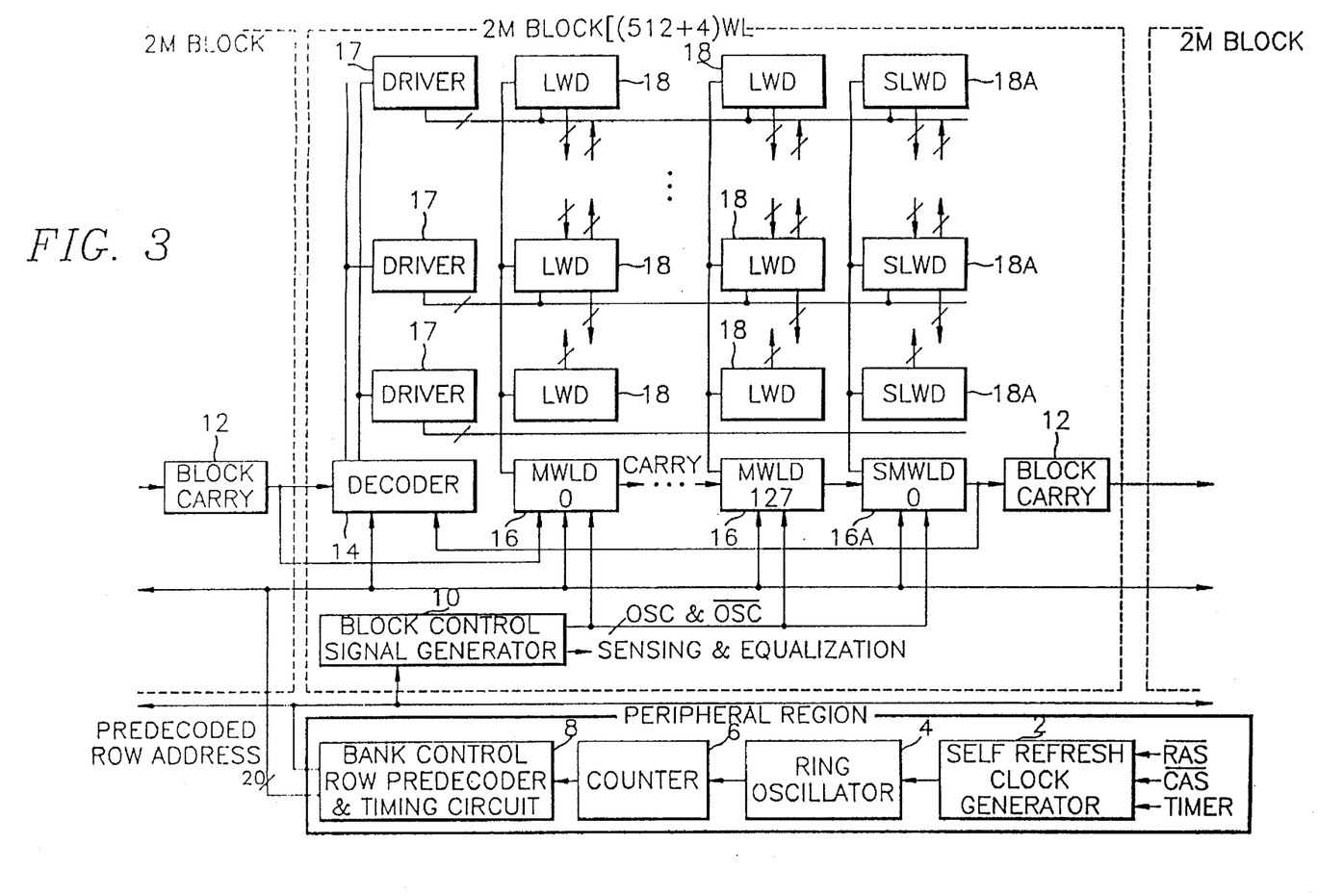
FIG. 3 is a schematic diagram showing a construction of a circuit for executing a self-refresh operation according to the present invention.

Referring to FIG. 3 showing a construction of a circuit for executing a self-refresh operation according to the present invention, a carry is produced from a main word line driver MWLDi (wherein i=0, 1, 2, 3, . . . ) and the carry has an effect on a main word line driver MWLD(i+1) next to the main word line driver MWLDi. Then, a block carry is produced from each block implemented by the unit of 2 M (M: mega=$2^{20}$) block.

The self-refresh mode begins by a CBR cycle as a combination of the signals $\overline{RAS}$ and $\overline{CAS}$ and a timer. Once the self-refresh mode begins, a master signal for controlling a self-refresh operation, for example, the signal from a self-refresh signal generation circuit 2 is enabled and a ring oscillator 4 which determines a self-refresh period is then operated. The ring oscillator 4 operates a counter 6 informing of a position of word line where a self-refresh operation is commenced. The counter 6 increases or decreases HD count based on the output of the ring oscillator 4 to obtain the address corresponding to the word line to be operated upon in the next cycle. The word line selection for performing a self-refresh operation is made by using the output of the counter 6 as a row address. That is, a TTL address buffer blocks any input to use the output of the counter 6 as the row address. The refresh operation of cell data is executed by controlling the word line selection and a charging sharing and sensing of memory cells and bit lines, using the output of the counter 6 and the master signal. At this time, a carry which informs the word line selection and the refresh operation performance is latched to a row decoder 14 and then used.

In a conventional self-refresh method, all peripheral circuits are operated by the toggling of a main signal when the self-refresh operation is executed with a certain self-refresh period. That is, when the main signal informs the activation of the self-refresh operation, a row predecoder and a row decoder are driven by using the output of counter as row address signal and the charging and sensing operations are then performed. Here, in case of the conventional self-refresh method, upon normal operation the refresh operation of memory cell is suppressed within the limit that there is not any loss of cell data, thereby minimizing the operation of DRAM. As a result, the power consumption by DRAM, when the DRAM is not accessed, can be reduced. Consequently, the conventional self-refresh operation can reduce the power consumption by minimizing the DRAM operation within only a given time. However, power consumption in the self-refresh method of the present invention can be more reduced than that in the conventional self-refresh method by minimizing operations of peripheral circuits upon the self-refresh operation. In addition thereto, it is possible to perform a burn-in operation in a wafer level in the same method as discussed in the self-refresh method of the present invention. Details of the burn-in operation will be hereinafter given. In the present invention, upon self-refresh operation an automatic word line selection is possible by using the carry as mentioned above. In other words, if a certain row is selected in the self-refresh mode, the carry which informs performance of the self-refresh operation is latched to the row decoder and the next word line is enabled. The word line is selected by the output of the counter 6 in a first self-refresh cycle, including a carry. According to the phase of a self-refresh oscillator in the next self-refresh activation, the carry is delivered to the next word line and the word line is then enabled. At this time, since a long line of the row address is not changed and an enable operation of the row predecoder and row decoder are stopped, the peripheral circuit current consumption caused by driving peripheral circuit is reduced.

Figure 4:
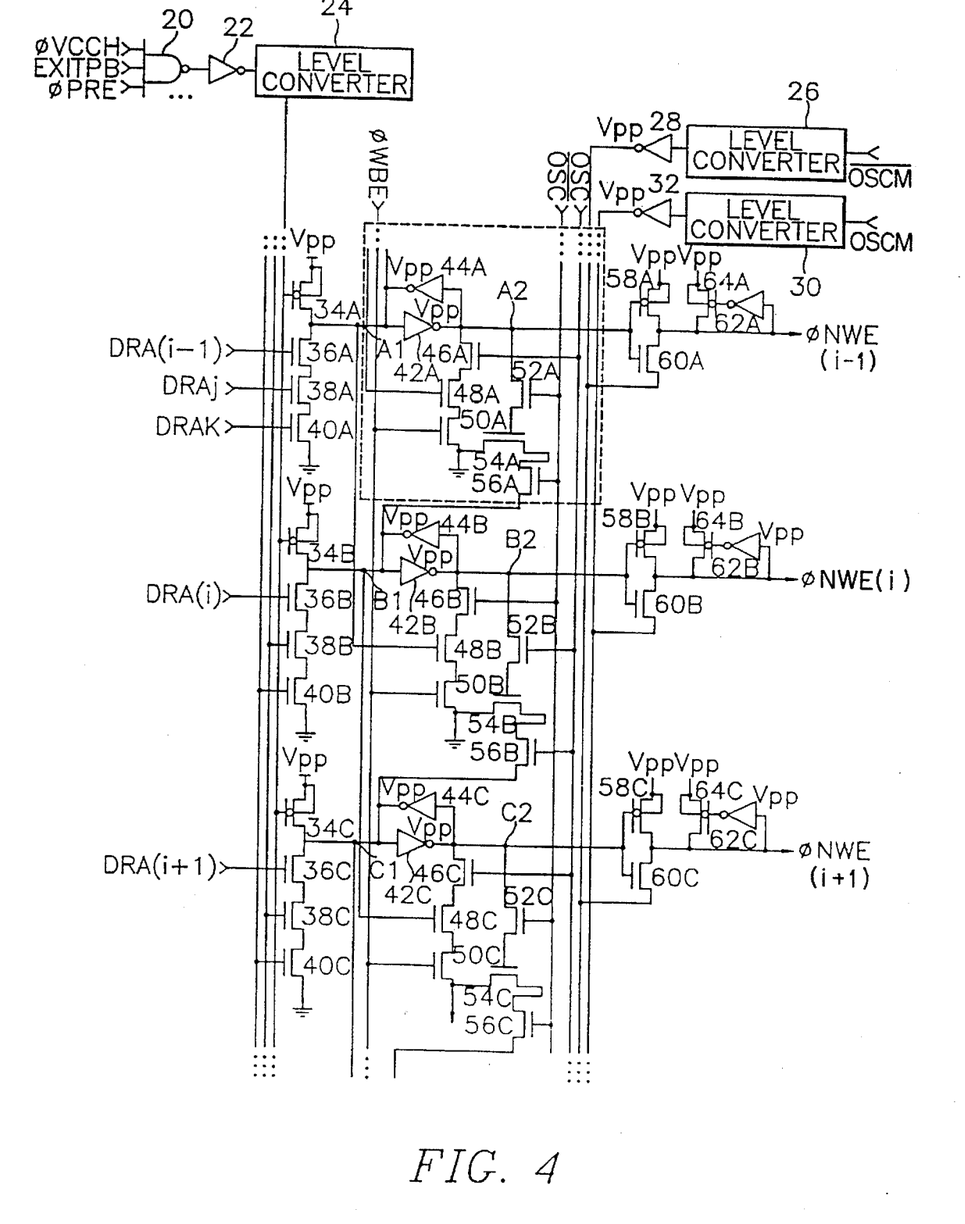
FIG. 4 is a circuit diagram showing an embodiment of a row decoder for executing a self-refresh operation according to the present invention.
Figure 5:
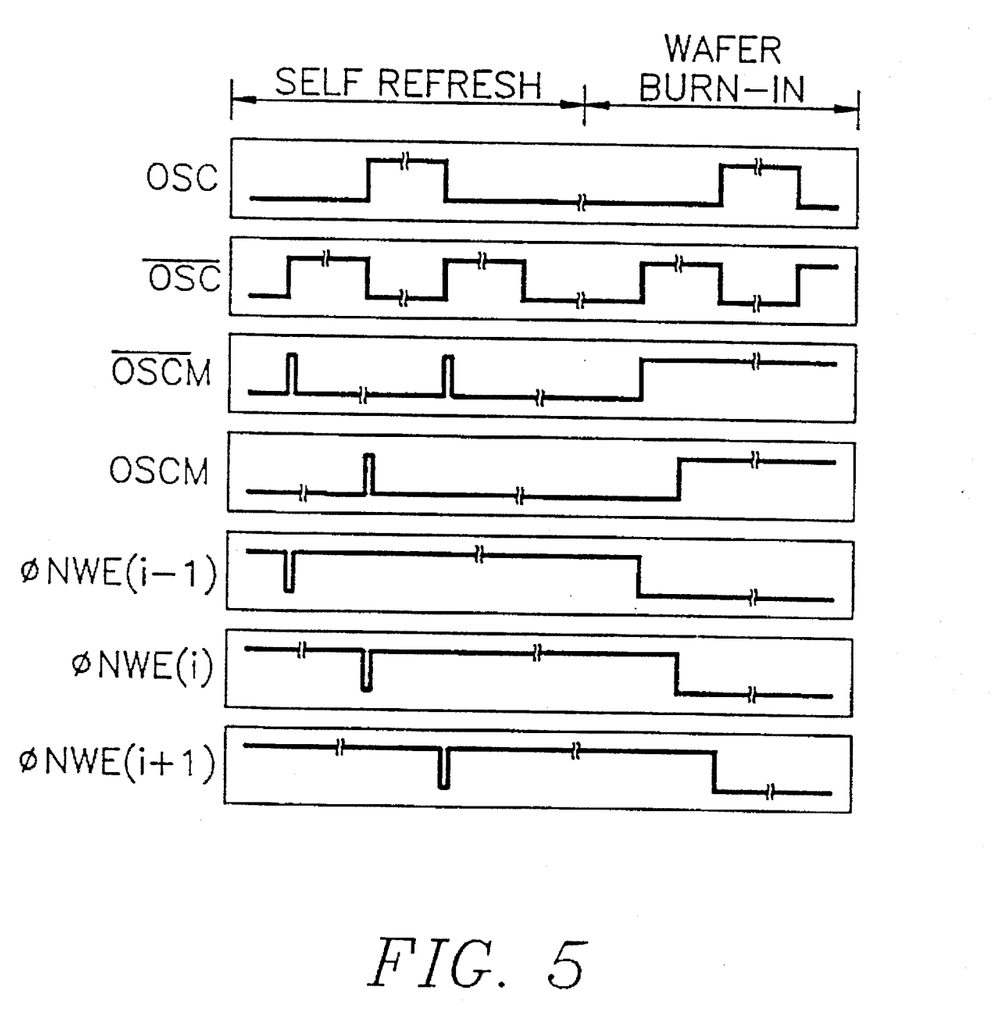
FIG. 5 is a timing diagram of each clock signal while executing self-refresh and burn-in operations according to the present invention.

FIG. 4 is a circuit diagram showing an embodiment of a row decoder employed according to the present invention and FIG. 5 is a timing diagram of each clock signal while executing the self-refresh operation. As shown in FIG. 4, a first row decoder comprises a first input stage 34A, 36A, 38A, and 40A. After being precharged by inputs of a precharge signal ø PRE and combination signals DRA(i–1), DRA(j), and DRA(k) of a decoded row address, which discharges a connection node A1 as an output node in response to a first combination input of the decoded row address, a first latch circuit 42A and 44A arranged between the connection node A1 and a given connection node A2 latches and generates the output signal of the first input stage 34A, 36A, 38A, and 40A. A first driver circuit 58A, 60A, 62A and 64A arranged between the connection node A2 and a first word line amplifies and generates the output signal of the first latch circuit 42A and 44A. On the other hand, a second row decoder comprises a second input stage 34B, 36B, 38B, and 40B, After being precharged by inputs of the precharge signal øPRE and the combination signals DRA(i), DRA(j), and DRA(k) of the decoded row address, which discharges a connection node B1 as an output node in response to a second combination input of the decoded row address, a second latch circuit 42B and 44B arranged between the connection node B1 and a given connection node B2 latches and generates the output signal of the first input stage 34B, 36B, 38B, and 40B. A second driver circuit 58B, 60B, 62B and 64B arranged between the connection node B2 and a second word line amplifies and generates the output signal of the second latch circuit 42B and 44B. A carry generator a main component of the present is arranged between the connection nodes A2 and B2 and outputs a carry corresponding to the voltage level of the connection node A2 to the connection node B1 in response to input of a burn-in enable signal øWBE or an oscillating clock OSC. The carry generator enables, a first switching transistor 46A whose one terminal is connected to the connection node A2 that is switched in response to a control input of the oscillating clock OSC. A second switching transistor 48A is serially connected to the channel of the first switching transistor 46A and is switched in response to an output signal of an input terminal of a third row decoder (not shown) adjacent to the first row decoder. A third switching transistor 50A is serially connected between the channel of the second switching transistor 48A and a terminal of a ground voltage and is switched in response to a control input of the burn-in enable signal øWBE. A fourth switching transistor 52A whose one terminal is connected to the connection node A2 is switched in response to a control input of a complementary oscillating clock $\overline{OSC}$. One terminal of a fifth switching transistor 54A is connected to the terminal of the ground voltage and the gate thereof is serially connected to the channel of the fourth switching transistor 52A. A sixth switching transistor 56A is serially connected between the channel of the fifth switching transistor 54A and the connection node B1 and is switched in response to the control input of the complementary oscillating clock $\overline{OSC}$. As clearly shown from the configuration of FIG. 4, the carry generator (or register) is included in every respective row decoder in the same configuration as mentioned above.

Explanation on the operational, the FIG. 4 circuit will be hereinafter given with respect to FIG. 5. A power-up signal øVCCH ensures a stable precharge upon the power-up. As known in the art, the power-up signal øVCCH is generated after reaching a preset level upon the power-up and enables operations of other circuits after supply of stable power. Upon the completion of the power-up, all row decoders are stably precharged by the power-up signal øVCCH (in the construction of the present invention, an internal high voltage level VPP). When the self-refresh mode begins, the precharge signal øPRE as a precharge pulse is generated from a main control signal and an output of the ring oscillator 4 and the row decoder is precharged in the activation state. The signal øWBE for enabling a wafer burn-in operation maintains a "high" state in the self-refresh mode. When the self-refresh mode begins under the combination of a WCBR cycle and timer, the master signal is generated and the ring oscillator 4 which determines the self-refresh period operates. Thereby, the row predecoder is driven by the output of the counter 6 and generates the output thereof.

The signals OSC and $\overline{OSC}$ shown in FIG. 4 respectively have an identical phase and a inverse phase in each memory bank of the output signal from the ring oscillator 4 driven by the main self-refresh signal. Signals OSCM and $\overline{OSCM}$ are pulses generated with the same phase as the signals OSC and $\overline{OSC}$, which determine word line enable time and non-selection in the self-refresh mode. If the DRA(i-1), DRA(j)

and DRA(k) are selected by the output of the counter 6, the connection node A1 is changed to a "low" state as series NMOS transistors 36A, 38A, 40A are turned on, in which inputs of the selected DRA(i–1), DRA(j) and DRA(k) are gated, so that the connection node A2 may be changed to a "high" state. When the signal $\overline{OSC}$ is changed to the "high" state, the connection node B1 is changed to the "low" state by the paths of NMOS transistors 54A and 56A, thereby maintaining the connection nodes A2 and B2 to be in the "high" states. However, since the signals OSCM and $\overline{OSCM}$ are in an opposite state, in a first cycle, only a signal øNWE(i–1) is activated by the signal $\overline{OCSM}$. When the next signal OSC is activated to be changed to the "high" state, a connection node C1 is changed to the "low" state by the connection node B2 through the paths mentioned above and the connection node A2 being in the "high" state in the first cycle by the NMOS transistors 46A and 48A is changed to the "low" state. Assuming that each "high" state of the connection nodes A2, B2 and C2 is termed a carry where the word line can be selected, by the reason that the output of row decoder is made to be the "low" state, if the connection nodes maintain the "high" states, in the first cycle, the carry exists in the connection nodes A2 and B2 and in a second cycle, the carry in the nodes B2 and C2. Sequentially, in a third cycle, the carry exists in the nodes C2 and D2 (not shown). Further, the signals OSCM and $\overline{OSCM}$ are in turn activated, two carries exist every one cycle, but only one row decoder becomes enabled. The operations discussed above can be indicated by the following TABLE <1>.

TABLE 1

|  | FIRST CYCLE | SECOND CYCLE | THIRD CYCLE |
| --- | --- | --- | --- |
| DRA(i – 1) | H | DON'T CARE | DON'T CARE |
| DRAj | H | DON'T CARE | DON'T CARE |
| DRAk | H | DON'T CARE | DON'T CARE |
| DRA(i) | L | DON'T CARE | DON'T CARE |
| DRA(i + 1) | L | DON'T CARE | DON'T CARE |
| A1 | L | H | H |
| A2 | H | L | L |
| øNWE (i – 1) | L | H | H |
| B1 | L | L | H |
| B2 | H | H | L |
| øNWE(i) | H | L | H |
| C1 | H | L | L |
| C2 | L | H | H |
| øNWE(i + 1) | H | H | L |
| OSC | L | H | L |
| OSCM | L | H | L |
| $\overline{OSC}$ | H | L | H |
| $\overline{OSCM}$ | H | L | H |

Here, the "high" levels of the signals DRA, OSC, and $\overline{OSC}$ are internal VCC levels and the other signals are in VPP levels as an internal "high" voltage. Areas within the dotted-line block of FIG. 4 can be referred to as a register because of storage of the carry. Inverters 62A, 62B, and 62C and PMOS transistors 64A, 64B, and 64C on the, øNWE node serve to raise the øNWE node up to the VPP level. Level coverters 24, 26, and 30 shifted from the internal VCC to the VPP positioned in the memory block prevent the charging or discharging of line having a large loading in order to reduce the power consumption by the VPP. The register positioned in the row decoder stores the carry, which is delivered to the row decoder adjacent the register according to the signal change of the ring oscillator 4, to thus render the next word line to be enabled. Therefore, only in the first cycle in the self-refresh mode, the word line is selected by the discharging of the row address line using the output of the counter, and the driving of the row predecoder and decoder. In the next cycle, the carry is transmitted by using the register without the driving of the peripheral circuits, thereby rendering the word line to be sequentially enabled. As a result, as it brings the reduction of the overall self-refresh current, the self-refresh method for the DRAM device of the present invention can achieve more excellent embodiment than that of the conventional DRAM device. The front portion of FIG. 5 shows a timing diagram of each clock signal while executing self-refresh operation. A self-refresh concept according to the present invention and a dual word line structure for embodying the present invention are explained in FIG. 3 (see technology disclosed in the paper "IEEE ISSCC digest of technical papers 1993", entitled "A 30 ns 256 Mb DRAM multi-divided array structure" and technology disclosed in the paper "IEEE journal of solid-state circuits, Vol. 23, No. 5, Oct. 1988", entitled "An experimental 1-Mbit CMOS SRAM with configurable organization and operation"). The word line is not driven, in the strapping method, by the driver being positioned on the end thereof selected by the row address, but driven, separated into several portions, by positioning an independent driver (local word line driver) at respective ends thereof and positioning a driver (main word line driver) for driving the local word line driver at one end thereof. Such a driving method has an advantage of relaxing the pitch of the metal used in the word line.

The circuit shown in FIG. 4 may be used for executing a burn-in operation in a wafer-level. An object of the burn-in operation in the wafer level is to lower the price of the devices. To check the reliability of the device, the burn-in operation is typically implemented. Throughout the burn-in operation, the device having possibility of causing a problem due to a long usage time is caught as the DRAM device operates at even the worse condition, thus to raise the reliability of the DRAM device. The burn-in operates the device during a predetermined time period under the high temperature and high operation voltage conditions, the operation condition of which depends upon respective devices. For example, assuming that the gate oxide of a cell access transistor has a thickness of about 10 nM (nM: 1 E-9 meter), the internal "high" voltage VPP for driving the word line is that of adding the internal VCC (INC) to 1.5 V and increases in proportional to the external voltage in above 4 V, while the level thereof maintains the external voltage (EVC)-1 V, and a physical maximum electric field to be applied to the gate oxide is below 6 MV/cm, a maximum external voltage applied to the device is obtained by the following expression (1).

$$VPP = IVC + 1.5 \leq 6E6/IE-2*10*10E-9 = 6[V] (EVC-1) + 1.5 < 6 \quad EVC < 5.5 \quad (1)$$

That is, a test which applies stress to the device is given under a preset condition in order to catch the lower quality of devices such as a bad quality of the gate oxide, a micro bridge of word lines, etc. A conventional burn-in time is about 1500 hours. However, when the real stress applied to the DRAM memory cell is calculated, assuming that a 256 M DRAM device is comprised of 32K word lines and 16K bit lines with a 16K refresh cycle, the stress applied to one word line becomes, TOTAL TIME=1500 hour*60 minutes/hour*60 second/minute
=540000 seconds STRESS TIME/1 WORD LINE=540000/16*1024 =329.6 seconds.

That is, the stress time applied to one word line is about 330 seconds. Also, the conventional burn-in operation is executed upon the package of device, as a final test is checked whether the device is well operated and performed in the normal condition after the device is fabricated and then completes sorting, package, and normal test. If a certain defect occurs in the burn-in process, the device can not be produced on a commercial scale as the reliability thereof is lower. In this case, since the device finds the defect in the final process, an unnecessary expense in performing sorting, package and test is spent, thereby causing the overall expense for device to be higher. To solve such a problem, the burn-in operation in the wafer level is executed, which has an advantage in expense. For example, the wafer level burn-in operation published by Toshiba in Japan necessitates a separate pad for applying an extra transistor, power, and signal to the device. However, the wafer level burn-in operation according to the present invention is capable of being executed without area penalty by the extra transistor and separate pad, so that it is possible that the burn-in operation is performed after the completion of package. Details of illustration on the burn-in operation will be hereinafter given.

The burn-in operation according to the present invention is embodied in the circuit diagram shown in FIG. 4. The wafer level burn-in operation is possible by maintaining the signal OSCM to be in the "high" state, as shown in the rear portion of FIG. 5. If the DRA(i−1), DRA(j), and DRA(k) are selected like the self-refresh operation as previously mentioned, the connection nodes A2 and B2 are at the "high" state and the signal øNWE(i−1) is activated to be in the "low" state. Then, when the signal OSC is enabled, the connection node C2 is changed to the "high" state by the connection node B2. At this time, in the case of the self-refresh operation, the connection node A2 is changed from the "high" state to the "low" state by the NMOS transistors 46A, 48A, and 50A. In the case of the burn-in operation however, since the signals OSCM and $\overline{OSCM}$ maintain the "high" states and the NMOS transistor 50A is turned off, the "high" state (carry) of the connection node A2 is not changed to the "low" state and the activated signal øNWE (i−1) is not disabled. That is, as the wafer level burn-in retains the carry generated in the previous stage, all word lines become sequentially enabled. After a preset time period, a test can be executed for checking the reliability for the word lines by the enable operation of all word lines. In case of 256 M DRAM device, if the cycle time is 100 ns, the whole word line is enabled within 100 E−9*16*1024=1.64 ms. In the meanwhile, in the case of Toshiba scheme, since the word lines are driven at a time by the extra transistor, there is a problem that an over peak current may occur. In the present invention, however, the word lines are enabled sequentially, thereby avoiding such an over peak current problem occurring in Toshiba scheme. The NMOS transistor constructed in the present invention is arranged at the near side of layout which holds the NMOS transistor in common for receiving the inputs of the DRA(j) and DRA(k), thereby preventing increment of the size of device. On the other hand, since the structure proposed by Toshiba requires extra pads, after the package of device, it is impossible to perform the burn-in operation by at a time enabling the word lines, whereas since the device according to the present invention does not require the extra pads, it is possible to perform the burn-in operation in the package state. That is, for example, if a WCBR + all addresses being in "high" state are received, the signals OSCM and $\overline{OSCM}$ maintain the "high" state, thereby executing the burn-in operation.

Although the constructions of FIGS. 3 and 4 of preferred embodiments of the present invention have been illustrated and described herein, it should be noted that elements of register and constructions of each clock signal and generating circuit thereof may be variably used without departing from the scope and spirit of the invention.

As described hereinabove, there is provided a semiconductor memory device and method according to the present invention capable of performing a lower power self-refresh operation in a high density memory device of 256 M DRAM by arranging a register (for example, in the present invention, a register constructed as only an NMOS transistor) in a word line driver to suppress operations of peripheral circuits, thereby lessening the portion of self-refresh current component, and a semiconductor memory device and method capable of performing a burn-in operation at a high speed by minimizing an area penalty to reduce a peak current in wafer and package states.

What is claimed is:

1. A semiconductor memory device having an oscillator which outputs a preset oscillating clock, and a plurality of row decoders which are selected in response to a combination input of a row address, said semiconductor memory device comprising:

a first row decoder comprising:
   a first input stage, after being precharged by inputs of a precharge signal and combination signals of a decoded row address, for discharging a first connection node as an output node in response to a first combination input of said decoded row address,
   a first latch circuit arranged between said first connection node and a given second connection node for latching and generating an output signal of said first input stage, and
   a first driver circuit arranged between said second connection node and a first word line for amplifying and generating an output signal of said first latch circuit;

a second row decoder comprising:
   a second input stage, after being precharged by inputs of the precharge signal and the combination signals of a decoded row address, for discharging a third connection node as an output node in response to a second combination input of said decoded row address,
   a second latch circuit arranged between said third connection node and a given fourth connection node for latching and generating an output signal of said second input stage, and
   a second driver circuit arranged between said fourth connection node and a second word line for amplifying and generating an output signal of said second latch circuit; and a carry generator arranged between said second connection node and said third connection node for outputting a carry corresponding to a voltage level of said second connection node to said third connection node in response to a control input of an oscillating clock, thereby suppressing power consumption during a self-refresh operation by selecting said second word line using said carry.

2. The semiconductor memory device as claimed in claim 1, wherein said carry generator comprises:

a first switching transistor having one terminal being connected to said second connection node to be switched in response to the control input of said oscillating clock;
a second switching transistor having one terminal being connected to a terminal of a ground voltage and a gate being connected to a channel of said first switching transistor; and a third switching transistor serially connected between a channel of said second switching transistor and said third connection node to be switched in response to the control input of said oscillating clock.

3. A self-refresh method of a semiconductor memory device, comprising the steps of:

sensing a self-refresh mode;

generating an address by a counter upon initiation of said self-refresh mode;

selecting a first word line to be refreshed through a first row decoder by using an output of said counter;

executing a refresh operation for memory cells connected to said first word line;

generating a carry in response to selection of said first word line and said refresh operation;

latching said carry to a second row decoder; and executing said refresh operation for a second word line different from said first word line through the latched carry.

4. A self-refresh method of a semiconductor memory device including a memory cell array having a plurality of memory cells in rows and columns, said method comprising the steps of:

selecting a first word line connected to a row of a first memory cell arranged in the row direction using a first word line driver and a first combination input of a row address by a first row decoder;

selecting a second word line connected to a row of a second memory cell arranged in the row direction using a second word line driver using a second combination input of a row address by a second row decoder;

controlling a driving of said second word line driver using an output of said first row decoder as a carry in response to an input of a given control signal, a carry generator having an input terminal connected to an output terminal of said first row decoder and an output terminal connected to an output terminal of said second row decoder; and upon a self-refresh operation, completing said second word line selection using said carry.

* * * * *